United States Patent
Wimpenny

(10) Patent No.: US 9,252,724 B2
(45) Date of Patent: Feb. 2, 2016

(54) 2G SUPPORT FOR 2G AND 3G/4G ENVELOPE TRACKING MODULATOR

(71) Applicant: Nujira Limited, Cambourne, Cambridge (GB)

(72) Inventor: Gerard Wimpenny, Cambridge (GB)

(73) Assignee: SNAPTRACK, INC., San Diego, CA (US)

( * ) Notice: Subject to any disclaimer, the term of this patent is extended or adjusted under 35 U.S.C. 154(b) by 76 days.

(21) Appl. No.: 14/169,204

(22) Filed: Jan. 31, 2014

(65) Prior Publication Data

US 2014/0218109 A1 Aug. 7, 2014

(30) Foreign Application Priority Data

Feb. 1, 2013 (GB) .................................. 1301851.0

(51) Int. Cl.
| | | |
|---|---|---|
| *H01Q 11/12* | (2006.01) | |
| *H04B 1/04* | (2006.01) | |
| *H03F 3/217* | (2006.01) | |
| *H03F 3/19* | (2006.01) | |
| *H03F 3/21* | (2006.01) | |
| *H03F 1/02* | (2006.01) | |

(52) U.S. Cl.
CPC .................. *H03F 3/217* (2013.01); *H03F 3/19* (2013.01); *H03F 3/211* (2013.01); *H03F 1/0222* (2013.01); *H03F 2200/102* (2013.01); *H03F 2200/432* (2013.01); *H04B 1/0483* (2013.01)

(58) Field of Classification Search
CPC .......... H03F 2200/39; H03F 2200/102; H03F 2200/432; H03F 1/0222; H03F 3/211; H04B 1/0483

USPC .................. 455/127.1, 127.3, 552.1, 553.1; 330/127, 132, 134

See application file for complete search history.

(56) References Cited

U.S. PATENT DOCUMENTS

| | | | | |
|---|---|---|---|---|
| 6,084,468 | A * | 7/2000 | Sigmon et al. ............... | 330/136 |
| 6,097,252 | A * | 8/2000 | Sigmon et al. ............... | 330/136 |
| 2004/0052312 | A1* | 3/2004 | Matero ........................ | 375/295 |
| 2005/0064830 | A1 | 3/2005 | Grigore | |

(Continued)

FOREIGN PATENT DOCUMENTS

| | | |
|---|---|---|
| EP | 1597821 B1 | 11/2007 |
| GB | 2398648 A | 8/2004 |
| GB | 246552 A | 5/2010 |

OTHER PUBLICATIONS

"Parent GB Patent Application No. GB 1301851.0 Search Report", Jul. 15, 2013, Publisher: GB IPO, Published in: GB.

*Primary Examiner* — Duc M Nguyen
(74) *Attorney, Agent, or Firm* — Patterson & Sheridan, L.L.P.

(57) ABSTRACT

There is provided an amplification stage including an envelope tracking modulated supply for tracking a reference signal, comprising a low frequency path for tracking low frequency variations in the reference signal and for providing a first output voltage, and a high frequency path for tracking high frequency variations in the reference signal and for providing a second output voltage, and a combiner for combining the first and second output voltages to provide a third output voltage, the amplification stage further comprising a first amplifier arranged to receive the first output voltage as a supply voltage, and a second amplifier arranged to receive the third output voltage as a supply voltage, wherein the first and second amplifiers are enabled in different modes of operation.

20 Claims, 14 Drawing Sheets

(56) References Cited

U.S. PATENT DOCUMENTS

| | | | |
|---|---|---|---|
| 2005/0271161 A1* | 12/2005 | Staszewski et al. | 375/308 |
| 2010/0194493 A1* | 8/2010 | Thompson | 333/132 |
| 2011/0089990 A1* | 4/2011 | Wimpenny | 327/355 |
| 2012/0068767 A1* | 3/2012 | Henshaw et al. | 330/127 |
| 2013/0116005 A1* | 5/2013 | Ganti et al. | 455/552.1 |
| 2013/0217345 A1* | 8/2013 | Balteanu et al. | 455/84 |

\* cited by examiner

2G SUPPORT FOR 2G AND 3G/4G ENVELOPE TRACKING MODULATOR

CROSS-REFERENCE TO RELATED APPLICATION(S)

British patent application GB 1301851.0, filed on Feb. 1, 2013, is incorporated herein by reference.

CROSS-REFERENCE TO RELATED APPLICATION(S)

British patent application GB 1301851.0, filed on Feb. 1, 2013, is incorporated herein by reference.

BACKGROUND TO THE INVENTION

1. Field of the Invention

The invention relates to envelope tracking modulated power supplies suitable for radio frequency power amplifier applications. The invention is particularly concerned with such power supplies in which a reference signal is used as an input to a low frequency path and a high frequency path, and in which each path generates separate outputs which are combined to form a supply voltage.

2. Description of the Related Art

Envelope tracking power supplies for radio frequency power amplifiers are well-known in the art. Typically a reference signal is generated based on an envelope of an input signal to be amplified. An envelope tracking power supply generates a supply voltage for the power amplifier which tracks the envelope of the input signal to be amplified.

FIG. 1 shows a prior art envelope tracking (ET) modulator architecture in which a frequency splitter 12 is used to divide an incoming envelope reference signal on line 10 into a high frequency (HF) path signal on line 14 and a low frequency (LF) path signal on line 16. The frequency splitter 12 may include a low pass filter 18 in the low frequency path and a high pass filter 20 in the high frequency path. The signal in the LF path on line 16 is amplified by an efficient switched mode amplifier 22, and the signal in the HF path on line 14 is amplified by a wideband linear amplifier 24. A frequency selective combiner 26 is used to combine the signals in the LF and HF paths after amplification. In FIG. 1 the combiner 26 is illustrated as including a low frequency combining element 28 in the low frequency path, and a high frequency combining element 30 in the high frequency path. A combined signal from the combiner 26 on line 32 provides a feed to a load 34, which in a typical application is a power amplifier (PA).

An example of a power amplifier system incorporating a supply architecture such as illustrated in FIG. 1 can be found in "Band Separation and Efficiency Optimisation in Linear-Assisted Switching Power Amplifiers", Yousefzadeh et al, [IEEE Power Electronics Specialists Conference 2008.

FIG. 2 shows an alternative prior art arrangement in which the frequency selective combiner 26 is an inductor-capacitor (LC) combiner. The low frequency combining element is an inductor 28a, and the high frequency combining element is a capacitor 30a. In this arrangement a feedback path 36 takes a signal from the combiner (or modulator) output on line 32, to the input of the linear amplifier 24. The signal on the feedback path 36 is subtracted from the signal in the high frequency path on line 14 by subtractor 38, to provide an input to the linear amplifier 24. The inclusion of this feedback path 36 achieves improved tracking accuracy compared to the arrangement of FIG. 1.

An example of a power amplifier system incorporating a supply architecture such as illustrated in FIG. 2 can be found in "Efficiency Optimisation in Linear-Assisted Switching Power Converters for Envelope Tracking in RF Power Amplifiers", Yousefzadeh et al, [IEEE Symposium on Circuits and Systems 2005.

It is an aim of the invention to provide an improved envelope tracking modulated power supply which addresses one or more of the above-stated problems.

SUMMARY OF THE INVENTION

The invention provides an amplification stage including an envelope tracking modulated supply for tracking a reference signal, comprising a low frequency path for tracking low frequency variations in the reference signal and for providing a first output voltage, and a high frequency path for tracking high frequency variations in the reference signal and for providing a second output voltage, and a combiner for combining the first and second output voltages to provide a third output voltage, the amplification stage further comprising a first amplifier arranged to receive the first output voltage as a supply voltage, and a second amplifier arranged to receive the third output voltage as a supply voltage, wherein the first and second amplifiers are enabled in different modes of operation.

Either the first or second power amplifiers may be RF (radio frequency) power amplifiers.

The high frequency path may include a linear amplifier, wherein the linear amplifier is enabled/disabled when the second power amplifier is enabled/disabled.

The first power amplifier may be disabled when the second power amplifier is enabled. The second power amplifier may be disabled when the first power amplifier is enabled.

The amplification stage may further comprise means for determining the power in the low frequency path when the first power amplifier is enabled. The amplification stage may further comprise enabling a path to a DC supply voltage when the determined power exceeds a threshold. The amplification stage may further comprise disabling a path to a DC supply voltage when the determined power is below a threshold.

The amplification stage wherein the supply to the first amplifier, when enabled, is preferably arranged to selectively receive either the DC supply voltage or the first output voltage. The additional supply voltage may be a battery voltage. The first amplifier may selectively receive the additional supply voltage by closure of a switch. The first amplifier may receive a supply voltage from the additional supply voltage rather than the first output voltage when the determined power exceeds an additional threshold.

The first power amplifier may be a power amplifier for a 2G or EDGE mode of operation. The second power amplifier may be a power amplifier for a 3G or 4G mode of operation.

There may be provided a feedback path from the output of the linear amplifier to the input of the linear amplifier, such that the linear amplifier in the correction path amplifies a signal comprising the full spectrum of the frequencies in the reference signal.

An RF amplifier may include a voltage supply stage. A wireless communication system may include a voltage supply stage. A wireless mobile device may include a voltage supply stage.

The invention further provides a method for an amplification stage including an envelope tracking modulated supply for tracking a reference signal, comprising a low frequency path for tracking low frequency variations in the reference signal and for providing a first output voltage comprising a supply voltage for a first amplifier, and a high frequency path for tracking high frequency variations in the reference signal and for providing a second output voltage, and a combiner for combining the first and second output voltages to provide a third output voltage comprising a supply voltage for a second amplifier, wherein the method comprises enabling one of the first and second output amplifiers in different modes of operation.

The may further comprise determining the power in the low frequency path, and enabling a path to a DC supply voltage when the determined power exceeds a threshold.

The method may further comprise disabling the path to the DC supply voltage when the determined power is below the threshold.

The first output amplifier may be enabled the supply voltage of the amplification stage is either the DC supply voltage or the first output voltage.

The second output amplifier may be enabled the supply voltage of the amplification stage is the third output voltage.

The amplification stage may be capable of a 2G mode of operation when the first amplifier is enabled or 3G/4G mode of operation when the second amplifier is enabled.

BRIEF DESCRIPTION OF THE FIGURES

The invention is now described by way of example with reference to the accompanying Figures, in which.

DESCRIPTION OF THE PREFERRED EMBODIMENTS

In the following description the invention is described with reference to exemplary embodiments and implementations. The invention is not limited to the specific details of any arrangements as set out, which are provided for the purposes of understanding the invention.

Embodiments of the invention are described in the following description in the context of application to different feedback architectures for the linear amplifier in the high frequency path. The invention and its embodiments are not limited to a particular feedback arrangement in the high frequency path.

The emergence of wideband 3G and 4G (e.g. long term evolution, LTE) wireless standards enables much greater spectral efficiency than narrowband legacy 2G standards such as GSM/EDGE. However the requirement for handsets to support GSM/EDGE will remain for many years to come, and therefore this provides an incentive for multi-mode power amplifiers. Although Multi-Mode Multi-Band (MMMB) power amplifiers are becoming more commonplace the incentive to integrate 2G and 3G/4G power amplifier chains is tempered by the fact that the maximum output power of a GSM/EDGE power amplifier is significantly greater than that of a 3G/LTE power amplifier.

An efficiency penalty in 3G/4G mode is suffered if a 2G/3G/4G MMMB power amplifier is sized correctly for 2G operation. Conversely, if a MMMB power amplifier module is implemented with two RF chains—one for GSM/EDGE and the other for 3G/4G—no such efficiency penalty is incurred. However the implementation of two RF chains is in itself disadvantageous.

The power supply requirements of a 2G power amplifier differ from those of 3G/4G power amplifiers in two significant respects. Firstly, the maximum output current requirement is significantly greater for 2G power amplifiers, and secondly the required bandwidth is significantly less for 2G power amplifiers and can be satisfied with a switched-mode only solution (i.e. no correction path is necessary).

Figure 3:
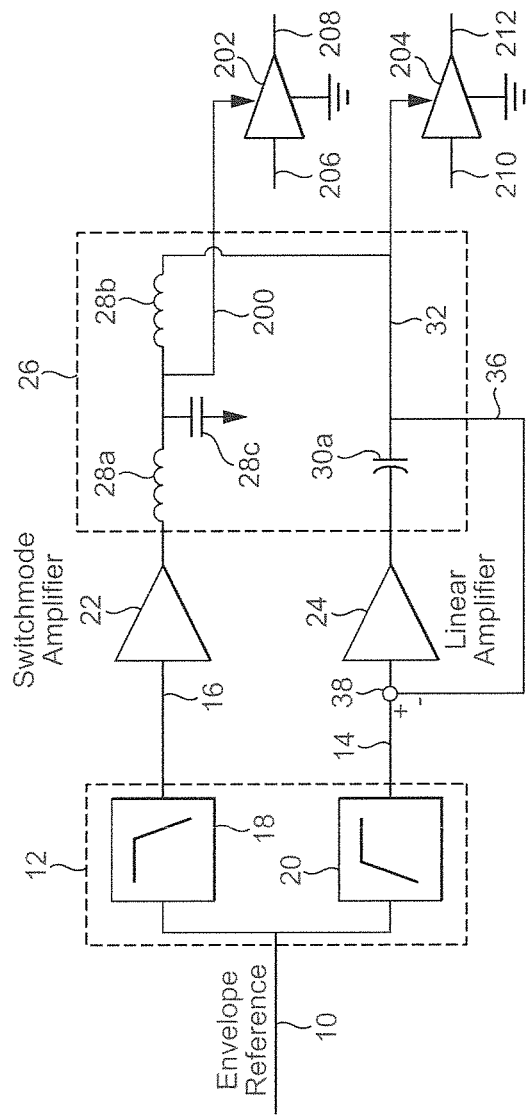
FIG. 3 illustrates an improved envelope tracking modulated supply in accordance with the invention, in which one power amplifier is connected to only the low frequency path and a second power amplifier is connected to both the low frequency path and the high frequency correction path.

FIG. 3 illustrates a mixed-mode modulator architecture in accordance with an embodiment of the invention which supports both 2G and 3G/4G power amplifiers.

With reference to FIG. 3, an arrangement in accordance with an embodiment of the present invention is shown. Where elements correspond to the arrangement of FIG. 2 similar reference numerals are used.

Figure 2:
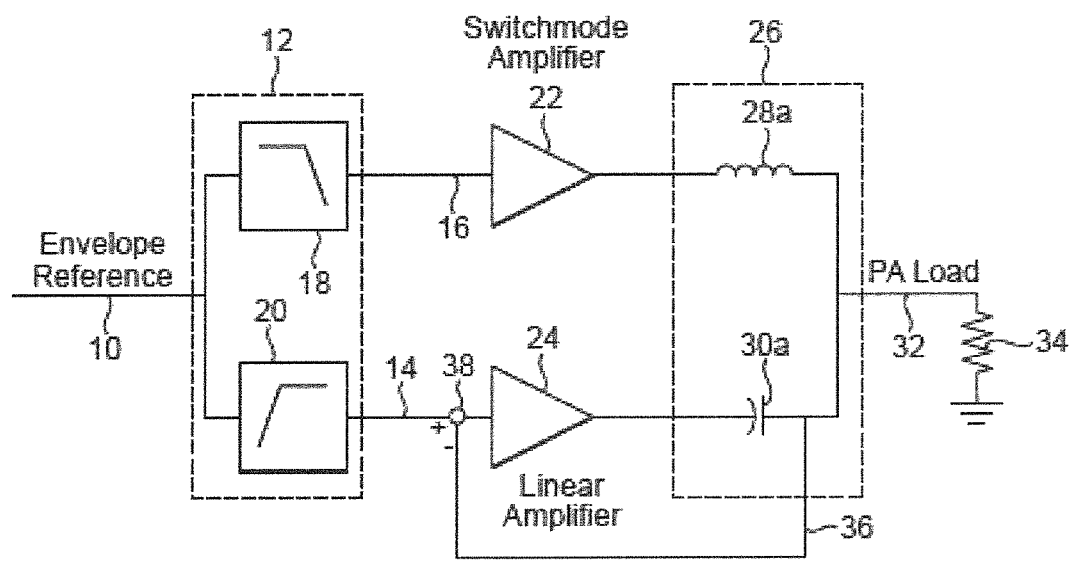
FIG. 2 illustrates a prior art envelope tracking modulated supply incorporating feedback in the high frequency correction path.

The arrangement of FIG. 2 is adapted such that in the low frequency path combiner there is provided an additional inductor and capacitor. Thus the output signal from the low frequency path passes through the inductor 28a and an inductor 28b, and is then combined with the low frequency path on line 32. In addition a capacitor 28c is connected in the low frequency path with one connected between the inductors 28a and 28b and the other terminal connected to electrical ground.

The arrangement of FIG. 3 preferably includes a modification to address a triangular ripple current which may flow in the inductor 28a of the combiner 26 as a result of the switching of the switched mode amplifier 22, and which also provides the filter required in the arrangement of FIG. 3. In the absence of capacitor 28c and inductor 28b this ripple current would be shunted through the output stage of the linear amplifier 24 via the capacitor 30a, to avoid the creation of unwanted voltage errors at the output of the combiner 26. The consequential ripple current flowing through the output of the linear amplifier 24 reduces its efficiency.

FIG. 3 thus shows a preferable arrangement in which the combiner 26 of FIG. 3 is adapted to include the additional capacitor 28c and the inductor 28b to shunt this ripple current to ground. The magnitude of the coupling factor between inductors 28a and 28b may range between 0 and 1. The ripple current due to the switched mode amplifier 22 now flows in the inductor 28b and is now shunted to ground via the capacitor 28c. The loss associated with the ripple current flowing in inductor 28a and passing through the linear output stage 24 is thus avoided.

The arrangement of FIG. 2 is further adapted in accordance with the invention to provide a first output voltage and a second output voltage dependent upon the mode of operation.

A first output voltage is provided on line 200 from the output of the switched mode amplifier 22 between the inductors 28a and 28b. The first output voltage is thus the filtered output of the low frequency path, filtered by the L-C arrangement provided by inductor 28a and capacitor 28c.

A second output voltage is the output voltage provided on line 32 from the combiner 26. The second output voltage is thus the combination of the outputs provided by the high frequency and low frequency paths.

The first output voltage on line 200 provides a supply voltage to an amplifier 202. The amplifier 202 is for example provided for amplification in a 2G GSM/EDGE system, and receives an input on line 206 and generates an amplified output on line 208. When the amplifier 202 is active the linear amplifier 24 is disabled. The amplifier 204 is also disabled.

In this mode of operation, which may be a 2G mode of operation, the supply to the amplifier may be operated with a fixed reference in a given slot to provide a DC output on line 200 which is varied on a slot-by-slot basis. Alternatively, the reference voltage on line 200 may be varied to track the envelope of the GSM/EDGE signal.

The second supply voltage on line 32 provides a supply voltage to the amplifier 204. The amplifier 204 is for example provided for amplification in a 3G/LTE system, and receives an input on line 210 and generates an amplified output on line 212.

When the amplifier 204 is operational, for example in 3G/4G mode, the power amplifier 202 is disabled and draws no supply current. The modulator architecture of FIG. 3 is then similar to that shown in FIG. 2 using the amplifier 204 only, in that the supply voltage for the amplifier 204 is generated in dependence on a combination of the low frequency and high frequency paths. The linear amplifier 24 is active when the power amplifier 204 is active.

FIG. 3 thus illustrates the main feature of the invention, in which in one mode a first power amplifier is utilised to receive an output of a low frequency path, and a second power amplifier and a linear amplifier of a high frequency path or correction path are disabled, and in which in another mode of operation the second power amplifier is utilised in combination with the high frequency path (or correction path) and low frequency path and the linear amplifier, the first power amplifier being disabled.

Figure 4:
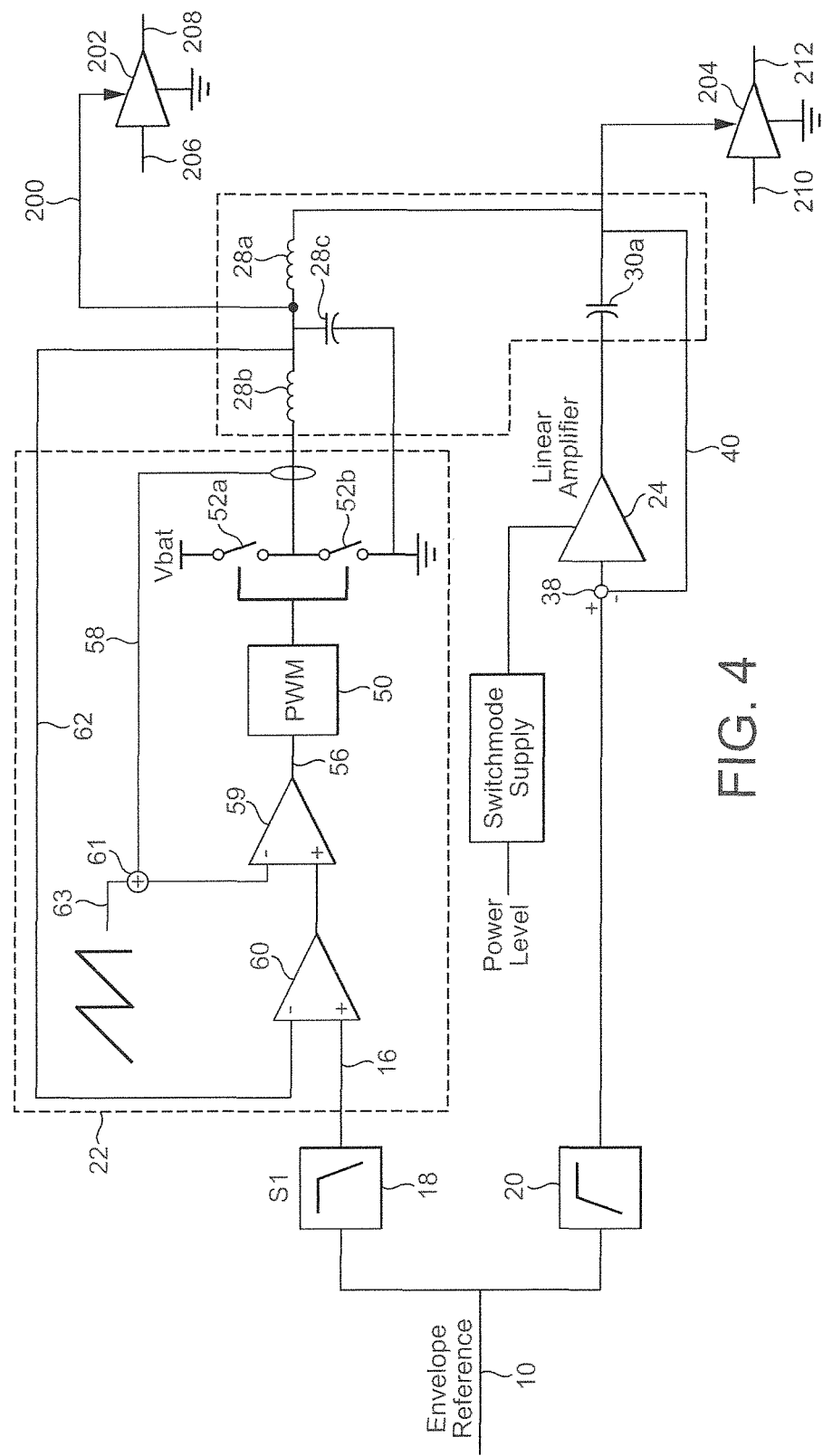
FIG. 4 illustrates further detail of the arrangement of FIG. 3 in an embodiment.

An advantageous implementation of the arrangement of FIG. 3, including the switched mode amplifier 22, is shown in FIG. 4 and is now described.

In a preferred arrangement the LF path switched mode amplifier 22 is preferably implemented as a peak-current-mode buck-converter which is a known prior art technique for implementing high bandwidth switched mode power supplies, and which is described as follows.

As illustrated in FIG. 4, the switched mode amplifier 22 includes a pulse width modulator (PWM) 50 which receives a control signal on line 56, and which controls a pair of switches 52a and 52b. Switch 52a is connected between a supply voltage and a common node 54, and switch 52b is connected between the common node and electrical ground. The supply voltage is provided by a battery, and is denoted Vbat. The pulse width modulator 50 controls the switches 52a and 52b to provide the low frequency path output to the combiner 26 in dependence on the control signal on line 56.

The arrangement of a pulse width modulator in combination with a switched supply is known in the art.

The switched mode amplifier 22 includes an inner current control feedback loop and an outer voltage control feedback loop.

The inner current control feedback loop senses the inductor current either directly or indirectly by sensing current in switch 52a or switch 52b, and provides a feedback path 58 to a combiner 61. The combiner 61 combines the feedback signal with a compensation ramp on line 63. The output of the combiner 61 provides an input to the inverting input of an amplifier 59. The amplifier 59 receives at its non-inverting input an output from an amplifier 60. The amplifier 59 generates the control signal on line 56.

The outer voltage control feedback loop provides a voltage feedback path 62 from the second terminal of the inductor 28b, where it connects to the inductor 28a and capacitor 28c. The feedback path provides a feedback signal to an inverting input of the amplifier 60. The amplifier 60 receives the low frequency path signal on line 16 at its non-inverting input.

Inductor 28b behaves as a current source due to the action of the inner current feedback loop provided by feedback path 58. A compensation ramp is provided on line 63 in this inner current feedback loop, and is used to prevent frequency halving at high duty cycles.

The outer voltage feedback loop provided by feedback path 62 is used to control the voltage at the junction of inductor 28b, inductor 28a, and capacitor 28c.

The peak-current-mode buck-converter as illustrated in FIG. 4 operates, in general, as follows.

The low pass filter 18 generates a signal representing low frequency variation in the reference signal. This signal on line 16 then comprises a control signal for the pulse signal for the buck switcher, comprising switches 52a and 52b, which has a duty cycle determined by the control signal, such that the voltage at the output of the buck switcher tracks the signal on line 16, i.e. the low frequency variation in the reference signal.

In addition, however, this control signal on line 16 is modified by the inner feedback current control loop and the outer feedback voltage control loop.

The outer feedback voltage control loop firstly adjusts the control signal in amplifier 60. The control signal (i.e. the low frequency reference signal) has the feedback signal on feedback path 62 removed therefrom. The feedback voltage on feedback path 62 represent the voltage at the output of the low frequency path, and the removal of this voltage from the low frequency signal on line 16 provides a signal representing the error between the output voltage and the reference voltage.

The inner feedback control loop secondly adjusts the control signal in amplifier 59. The second adjusted control signal (output from amplifier 59) has the signal on feedback path 59 removed therefrom. The feedback signal on feedback path 58 represents the output current.

FIG. 4 thus illustrates an exemplary implementation of a switched mode amplifier 22 in an envelope tracking architecture, which may be used in embodiments of the invention.

Figure 5:
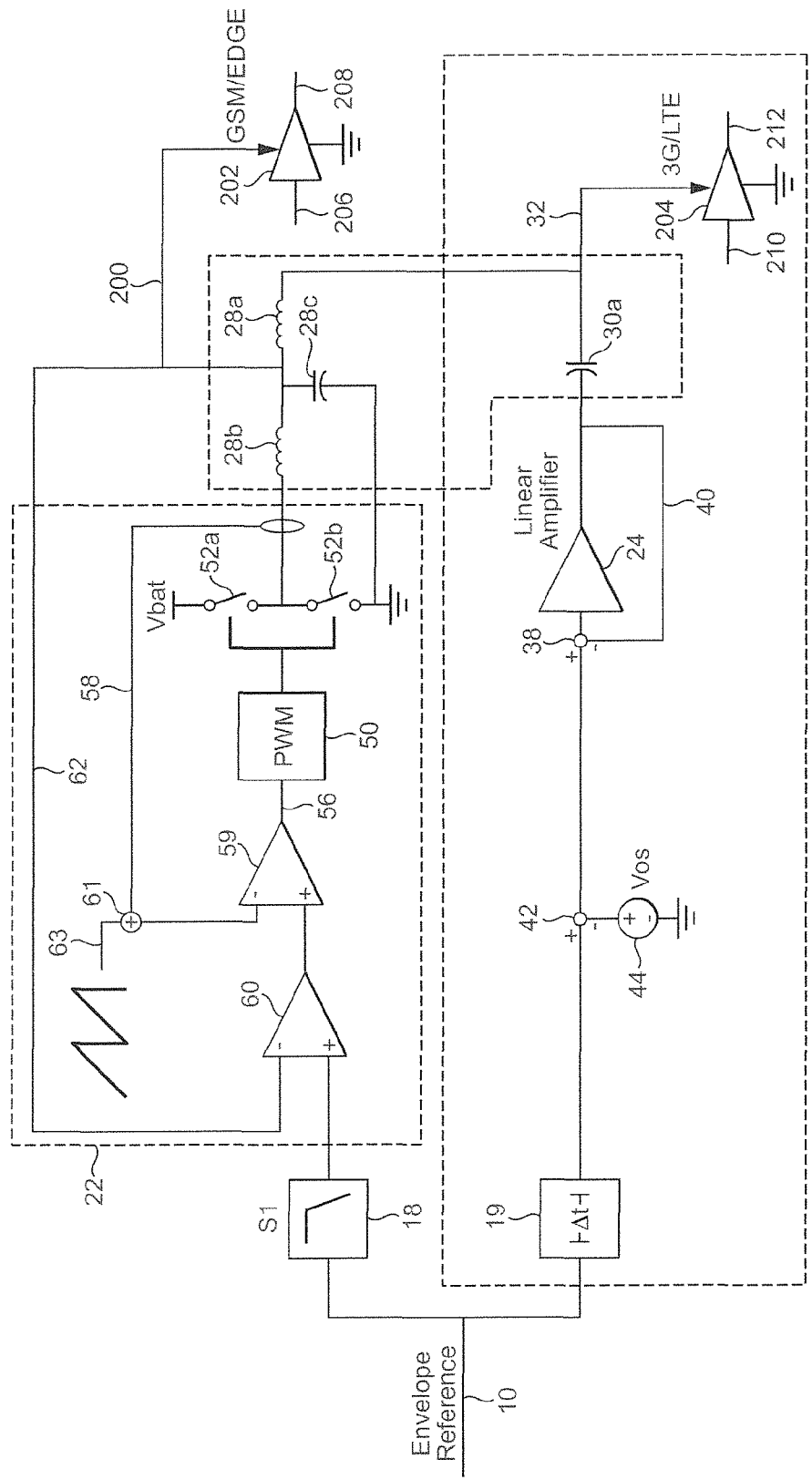
FIG. 5 illustrates further detail of the arrangement of FIG. 3 in an embodiment.

With reference to FIG. 5 there is illustrated an advantageous arrangement in which the arrangement of FIG. 4 is adapted to include a feedback path for the linear amplifier which is taken directly from the output of the linear amplifier 24 rather than the output of the combiner. Embodiments of the invention are described in the following in the context of application in such an arrangement, although the invention and embodiments are not limited to such an advantageous arrangement.

The signal at the output of the linear amplifier 24 in the high frequency path in the arrangements of FIG. 2 where a feedback path is provided for the linear amplifier is used does not contain any LF components. As a consequence the peak-to-peak amplitude of the signal to be amplified by the linear amplifier in this arrangement is greater than the peak-to-peak amplitude would be if it were a full spectrum envelope signal. This reduces the efficiency of the linear amplifier 24 as its supply rails must be set to allow linear amplification of this large peak-on-peak signal.

In the arrangement of FIG. 5, the high frequency filter 20 is eliminated and a full spectrum signal provided to the input of the linear amplifier. In addition the feedback path is taken from the output of the linear amplifier rather than the output of the combiner. This avoids the low frequency content being removed by the feedback (as the signal at the output of the combiner includes the low frequency signal content present in the full spectrum signal in the correction path). Hence the linear amplifier 24 is required to amplify a full-spectrum signal which has a lower peak-to-peak amplitude than the signal at the output of the linear amplifier in the prior art arrangements of FIGS. 2 to 4.

FIG. 5 is also adapted to show the modulator architecture which supports two power amplifiers, such as both 2G and 3G/4G power amplifiers, as described above with reference to FIG. 3.

For example in 2G mode the blocks (including the linear amplifier) in the correction path are disabled, and the switched mode amplifier reverts to a peak-current-mode controller with a single inductor-capacitor section (two pole) output filter provided by inductor 28b and capacitor 28c, providing a modulated supply to the power amplifier. In 3G/4G mode the blocks (including the linear amplifier) in the correction path are enabled, and the modulated supply voltage is provided on line 32 to the 3G/4G amplifier 204, with the amplifier 202 disabled.

Thus the converter 22 as shown in FIG. 5 may be operated in a fixed supply mode or in a full envelope tracking mode.

Further modifications may be implemented in the arrangement of FIG. 5, examples of which follow.

To maximise efficiency, a DC offset voltage 44 is optionally added to the input signal to allow rail-to-rail operation of the linear amplifier. The value of the DC offset voltage is chosen to position the DC voltage at the output of the subtractor 42 to allow the lowest possible supply voltage to be used for the linear amplifier 24.

The linear amplifier is preferably always operated with the minimum possible supply voltage, which is provided by an efficient switched mode supply.

Any delay associated with the switched mode amplifier 24 in the low frequency path may optionally be compensated using a delay matching element 19 in the high frequency path including the linear amplifier.

Considering FIG. 5 further, the output voltage of the supply modulator 22 is provided by a buck switcher formed of the switches 52a, 52b connected to a battery supply voltage Vbat. The linear correction path is added to the buck switcher output, to provide high frequency correction to the low frequency switched voltage, via the AC coupling capacitor 30a. As a result of combining with the correction voltage, the modulated supply is hence capable of providing short term output voltages on line 32 which are higher than the supply voltage Vbat. However the average output voltage on line 32 can be no larger than Vbat.

There are some circumstances in which having an average output voltage which cannot exceed the supply (battery) voltage may be a problem. For example, this may be a problem when operating with a depleted battery with a low peak-to-average-power (PAPR) signal, as the average output voltage may then need to be higher than the battery voltage. Hence it is desirable for the switched mode power supply 22 to be capable of both buck and boost operation, to boost the average output voltage to a level above the battery voltage Vbat.

It is well known in the art that conventional boost mode converters are difficult to stabilise on account of a right-half-plane (RHP) zero in their response characteristic. This results in such converters exhibiting a much lower closed loop bandwidth for a given switching frequency than a buck converter. Most prior art converters incorporating boost converters suffer from this disadvantage.

A preferred arrangement addresses these prior art problems by providing a voltage supply stage comprising an input supply voltage. A first and a second switch are connected in series, the first and second series connected switches being connected in parallel with the input voltage source. A third switch and capacitor are connected in parallel with the first switch. A fourth switch is connected between the connection of the third switch and the capacitor and an output. A fifth switch is connected between the output and electrical ground. In a first phase of operation, the first and fourth switches are closed, and the second, third and fifth switches are open. In a second phase of operation the second, third and fifth switches are closed, and the first and fourth switches are open. The duty cycle of operating phases is controlled such that the average voltage on the output varies between 0 volts and twice the input supply voltage. This is now described more fully with reference to the following Figures.

Figure 6A:
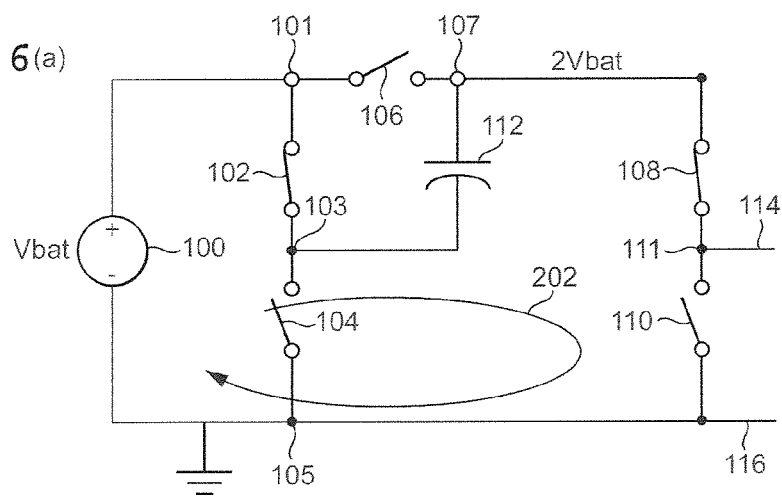
FIGS. 6(a) to 6(c) illustrate further detail of the arrangement of FIG. 3 in an embodiment.
Figure 6B:
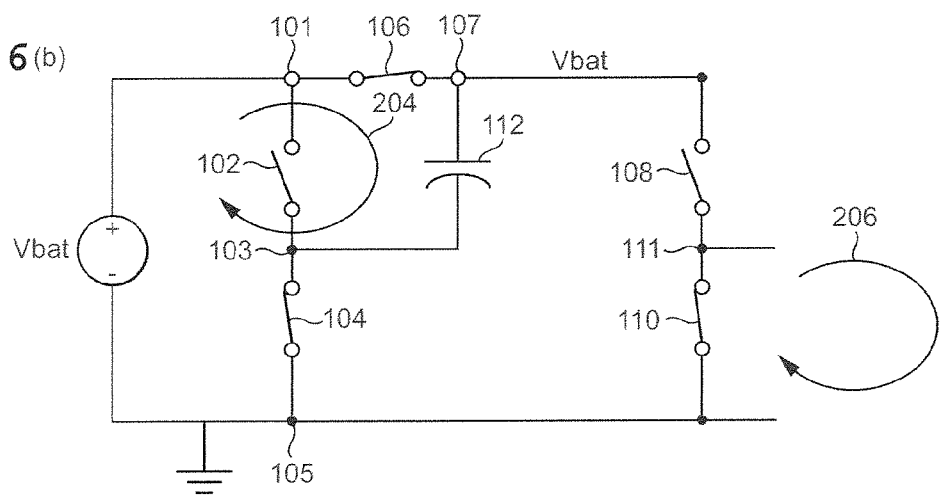

FIGS. 6(a) and 6(b) illustrate a switched capacitor voltage doubler cascaded with a buck output stage in which all switches are synchronously driven, in accordance with an embodiment of the invention. This embodiment shares the same control characteristics as a conventional buck converter but does not suffer from the bandwidth limitations suffered by most boost and buck-boost converter topologies. The exemplary arrangements include a battery for providing the input voltage source.

The buck output stage in FIGS. 6(a) and 6(b) comprises a battery 100, switches 102, 104, 106, 108, 110, and a capacitor 112. The battery 100 is connected between nodes 101 and 105. The switch 102 is connected between nodes 101 and 103. The switch 104 is connected between node 103 and node 105. The switch 106 is connected between nodes 101 and 107. The capacitor 112 is connected between nodes 103 and 107. The switch 108 is connected between node 107 and node 111. The switch 110 is connected between node 105 and node 111. Node 105 is connected to electrical ground. Node 111 is connected to an output line 114 on which the output voltage is generated.

FIG. 6(a) shows the operation in a first phase (phase 1) of the switching cycle, and FIG. 6(b) shows the operation in a second phase (phase 2) of the switching cycle.

In the first phase of operation, as shown in FIG. 6(a), the switches 102 and 108 are closed, and the switches 104, 106 and 110 are open. The arrow 202 denotes current flow in the arrangement of FIG. 6(a).

In the second phase of operation, as shown in FIG. 6(b), the switches 104, 106 and 110 are closed, and the switches 102 and 108 are open. The arrows 204 and 206 denote current flow in the arrangement of FIG. 6(b).

A controller, which is not shown in FIGS. 6(a) and 6(b), controls the switching between the first and second phases of operation. By controlling the switching between the first and second phases of operation, and the duration for which each phase is active (i.e. the duty cycle), the supply voltage can vary between zero volts and twice the battery voltage.

The supply rail to the output buck switches 108, 110 at node 107 varies between voltages Vbat and 2×Vbat, but the average output voltage of this stage can be set to any value between 0V and 2Vbat depending on the waveform duty cycle.

Figure 6C:
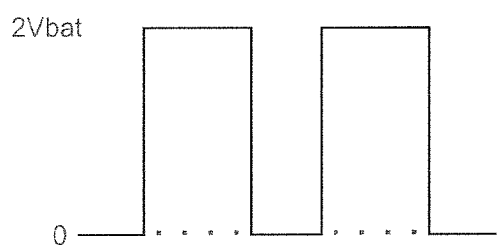
Figure 7A:
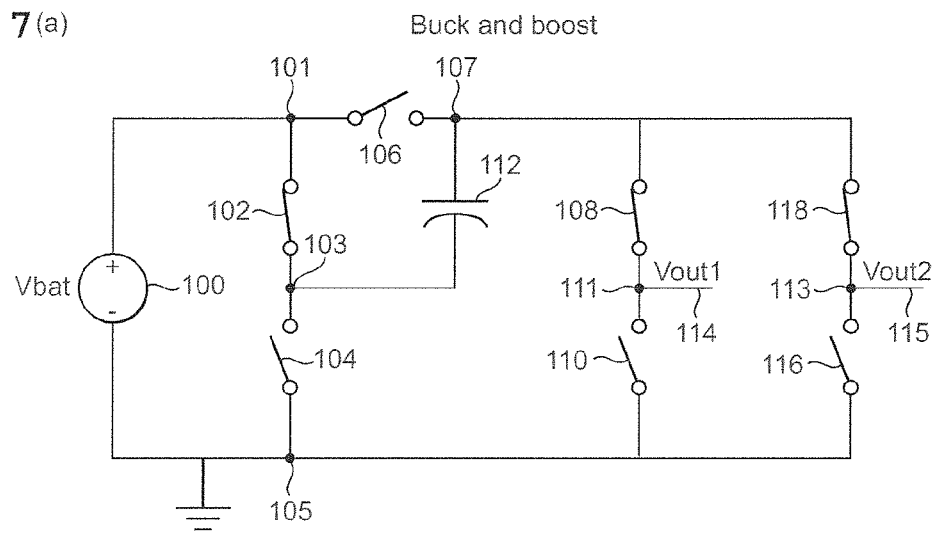
FIGS. 7(a) to 7(d) illustrates further detail of the arrangement of FIG. 3 in an embodiment.
Figure 7B:
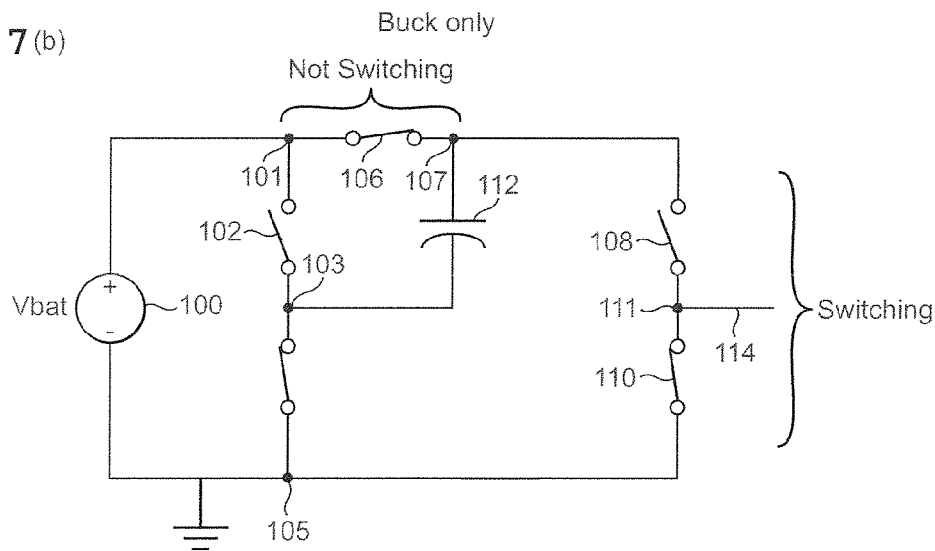
Figure 7C:
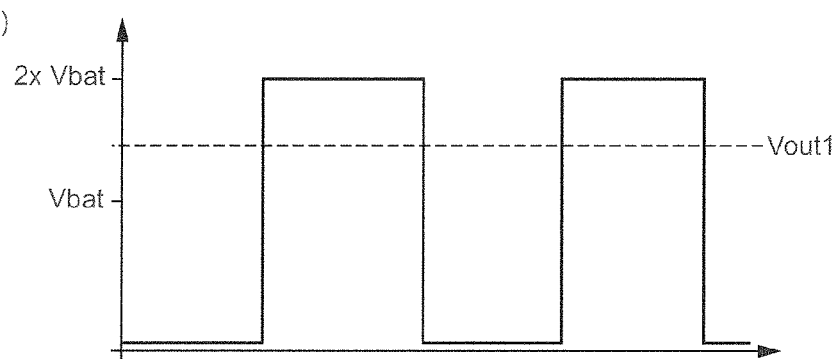
Figure 7D:
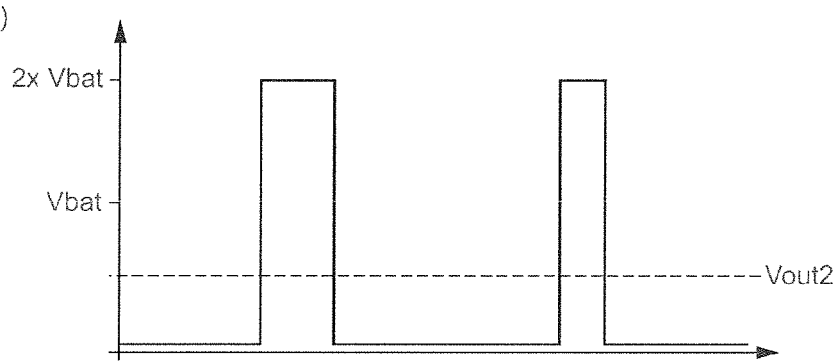

As shown in FIG. 6(*c*) the output voltage on line 114 comprises a pulse which switches between 0V and 2×Vbat. The duty cycle of switching between the first and second phases can be varied to provide a desired average voltage between 0 volts and 2×Vbat The topology of FIGS. 6(*a*) and 6(*b*) does not exhibit a right-half-plane zero and hence does not suffer the problems of the prior art and is capable of high closed loop bandwidth.

FIG. 7(*a*) shows an extension of the principle described with reference to FIGS. 6(*a*) and 6(*b*) to provide a two output buck-boost converter capable of outputting two output voltages each having values between 0 volts and 2×Vbat.

As illustrated in FIG. 7(*a*), the circuit of FIGS. 6(*a*) and 6(*b*) is extended to include further switches 116 and 118. Switch 116 is connected between node 105 and a node 113. Switch 118 is connected between nodes 107 and 113. Node 113 is connected to an output line 115 on which a second output voltage is generated, the output voltage on line 114 now being referred to as a first output voltage.

In a buck and boost operation the circuit of FIG. 7(*a*) may be controlled similar to the control of the circuit in FIGS. 6(*a*) and 6(*b*). FIG. 7(*a*) shows the switches in a first phase of operation, consistent with FIG. 6(*a*). In a second phase of operation the switches of FIG. 7(*a*) may be switched to the positions shown in FIG. 7(*b*), with switch 118 open and switch 116 closed. Different voltages are achieved for the first and second voltages by controlling the duty cycle of the switch pairs 108/110 and 118/116 independently. A lower voltage output is produced by curtailing the pulse width of the lower voltage buck output stage.

The arrangement of the switches in FIG. 7(*b*) illustrates a buck only mode of operation, in which the output voltage may only vary between 0V and Vbat. In this mode, switches 106 and 104 are permanently closed, and switch 102 is permanently open. Switches 108 and 110 are toggled in first and second phases of operation to vary the duty cycle of the output waveform and achieve an average voltage between 0 volts and Vbat.

Thus if a boost operation is not required, the switched capacitor doubler can be set to a fixed 'through' mode as shown in FIG. 7(*b*), with only switching between 0 and Vbat occurring in the buck output stage, thereby reducing losses associated with both stages.

If a peak-current-mode control switcher is used as the switched mode amplifier 22 in the low frequency path, an exemplary implementation of which is illustrated in FIG. 4, the loop dynamics are unaffected by the sudden change of supply rail voltage feeding the buck output stage, as the action of the current feedback is to make the inductor behave as an ideal current source.

FIGS. 7(*c*) and 7(*d*) illustrate the generation of two supply voltages in buck-boost operation.

As illustrated in FIG. 7(*c*), for the first output voltage Vout1 the pulse width modulator controls the switches to maintain a high average voltage, such that in this example the first output voltage Vout1 has an average value higher than Vbat.

As illustrated in FIG. 7(*d*), for the second output voltage Vout2 the pulse width modulator controls the switches to maintain a lower average voltage, such that in this example the second output voltage Vout2 has an average value lower than Vbat.

Figure 8:
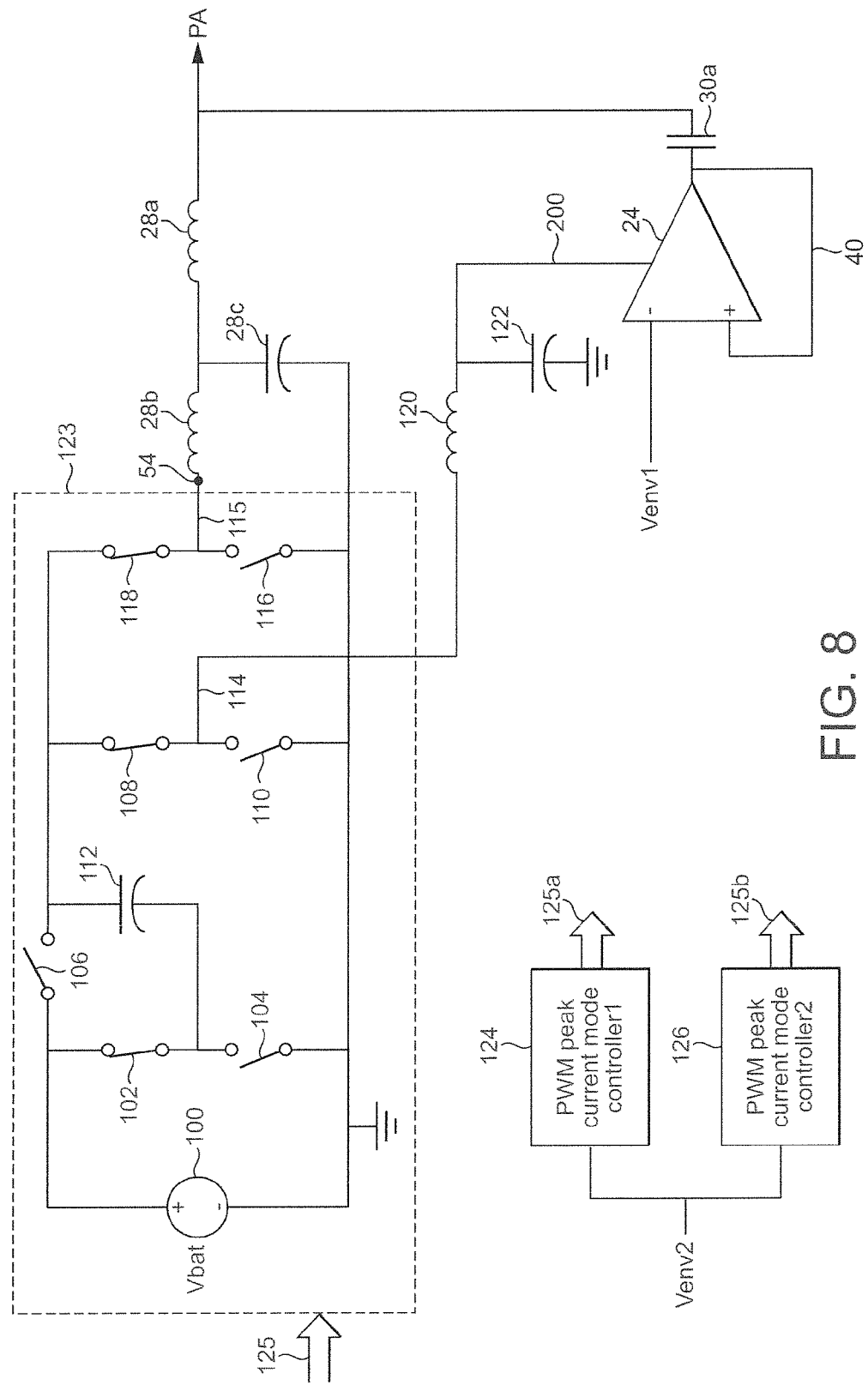
FIG. 8 illustrates further detail of the arrangement of FIG. 3 in an embodiment.

FIG. 8 shows the dual-output buck-boost architecture of 7(*a*) applied in the advantageous context of an exemplary envelope tracking modulator. To simplify the illustration, the low frequency path including the pulse width modulator 50 for controlling the switching of the switcher is not fully shown in FIG. 8.

The reference numeral 123 denotes the boost-buck switched supply stage of FIG. 7(*a*), which replaces the switches 52*a*, 52*b* of the FIG. 5 arrangement. The arrow 125 denotes the control signal for the switches of the boost-buck switched supply stage, which are provided by a pulse width modulator (such as pulse width modulator 50 of FIG. 4), operating under the control of a signal representing the low frequency variation in the reference signal.

A main supply is provided on the line 115 corresponding to the second output voltage in FIG. 7(*a*) and is used to provide the low frequency part of the modulator output (after filtering).

A lower power auxiliary supply may be provided on line 114 corresponding to the first output voltage in FIG. 6(*a*), and is used to provide the supply rail to the correction path linear output amplifier 24. The lower power auxiliary supply is provided to the linear amplifier 24 through an inductor-capacitor filter arrangement provided by inductor 120 and capacitor 122, which mirrors the inductor-capacitor filter arrangement provided by inductor 28*b* and capacitor 28*c* in the low frequency path.

As illustrated further in FIG. 8, two switch controllers are provided: a first PWM peak current mode controller 124 and a second PWM peak current mode controller 126.

Figure 1:
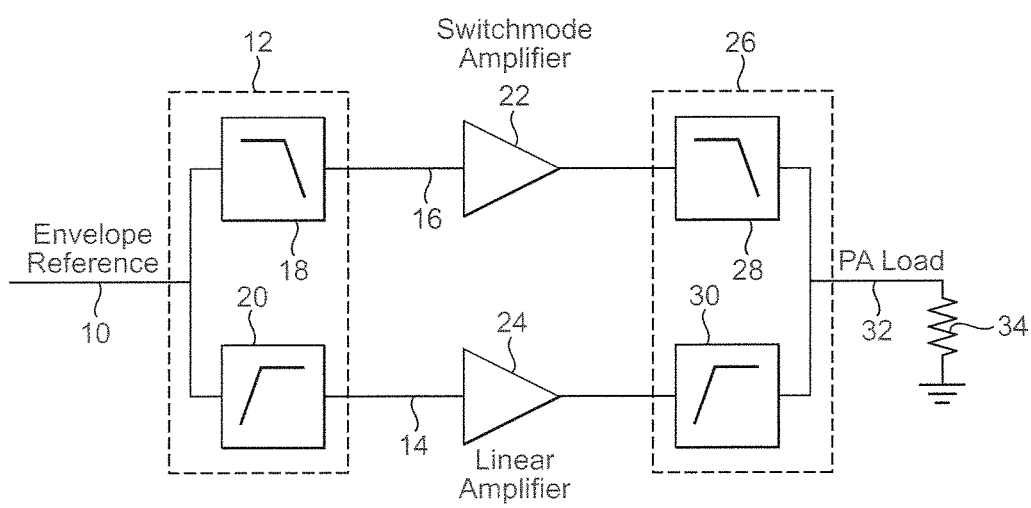
FIG. 1 illustrates a prior art envelope tracking modulated supply including a low frequency path and a high frequency correction path.

With reference to FIG. 8 there is illustrated an advantageous arrangement in the correction path in which a feedback path for the linear amplifier 24 is taken directly from the output of the linear amplifier, rather than the output of the combiner. In addition the high pass filter 20 of the FIG. 3 arrangement is eliminated. As a result a full-spectrum representation of the reference signal is provided on the path 14 rather than a signal with low frequency components removed, as in the arrangements of FIGS. 1 and 2. Such an arrangement offers efficiency improvements over the prior art, as it allows the peak-to-peak supply voltage of the linear amplifier 24 to be minimised. Embodiments of the invention are preferably implemented in such an arrangement, although the invention and embodiments are not limited to such an advantageous arrangement. The invention is advantageously applied in such an architecture.

Each of the controllers 124 and 126 receive the low frequency reference signal (or envelope signal) as an input, such as the signal on line 16 in FIG. 3 (or a signal derived therefrom). The first PWM peak current mode controller 124 controls the switches 118 and 116 which are used to produce the switcher output voltage on line 115, and the second PWM peak current controller 126 synchronises in frequency and phase with the first controller and controls the switches 108 and 110 which are used to produce the voltage supply for the linear amplifier on line 114. Thus each of PWM peak mode controllers 124 and 126 is shown to provide general control signals 125*a* and 125*b*, which form part of the control signals 125 to the switched supply stage 123.

Voltage doubler switches are controlled by the PWM waveform of the first or second controller, whichever has the larger duty cycle, to ensure the input to both half-bridge stages (switches 108, 110 and 118, 116) is 2Vbat when switches 108 or 118 are made (closed). Equivalently, the PWM waveform controlling switches 102, 104 and 106 is a logical 'OR' function of the PWM waveforms of controllers 1 and 2 (i.e. controllers 124 and 126).

The main output supply on line 115 is modulated, whereas the auxiliary output supply—namely the output to the linear amplifier on line 200—may be a fixed voltage, or a voltage which is set according to the average power of the RF signal on a slot-by-slot basis in a communication system which is time-slot based.

Activation of the boost mode to increase the output voltage to up to double the battery voltage can be controlled directly by a baseband controller, for example on a slot-by-slot basis, depending, for example, on any one or combination of the RF power level, the peak-to-average power ratio, and the battery voltage in a time-slot. The baseband controller can control the PWM peak current mode controllers 124 and 126.

With reference to the linear amplifier feedback arrangement of earlier Figures, the signal at the output of the linear amplifier 24 in the high frequency path is not a full-spectrum signal because it does not contain any low frequency components. As a consequence the peak-to-peak amplitude of the signal at this point is greater than the-peak-to-peak amplitude would be if the full spectrum of the envelope signal were present. This reduces the efficiency of the linear amplifier 24, as its supply rails must be set to allow linear amplification of this larger peak-to-peak signal.

In an alternative improved arrangement as shown in FIG. 8, the feedback path is taken from the output of the linear amplifier 24 itself rather than the output of the combiner, and thus provides a signal which has a full spectrum envelope signal. Hence the feedback signal has lower peak-to-peak amplitude than the signal at the output of the linear amplifier in the prior art linear amplifier feedback arrangement of earlier Figures.

With reference to FIG. 8 there is illustrated an advantageous arrangement in which a feedback path for the linear amplifier is taken directly from the output of the linear amplifier rather than the output of the combiner.

Figure 9:
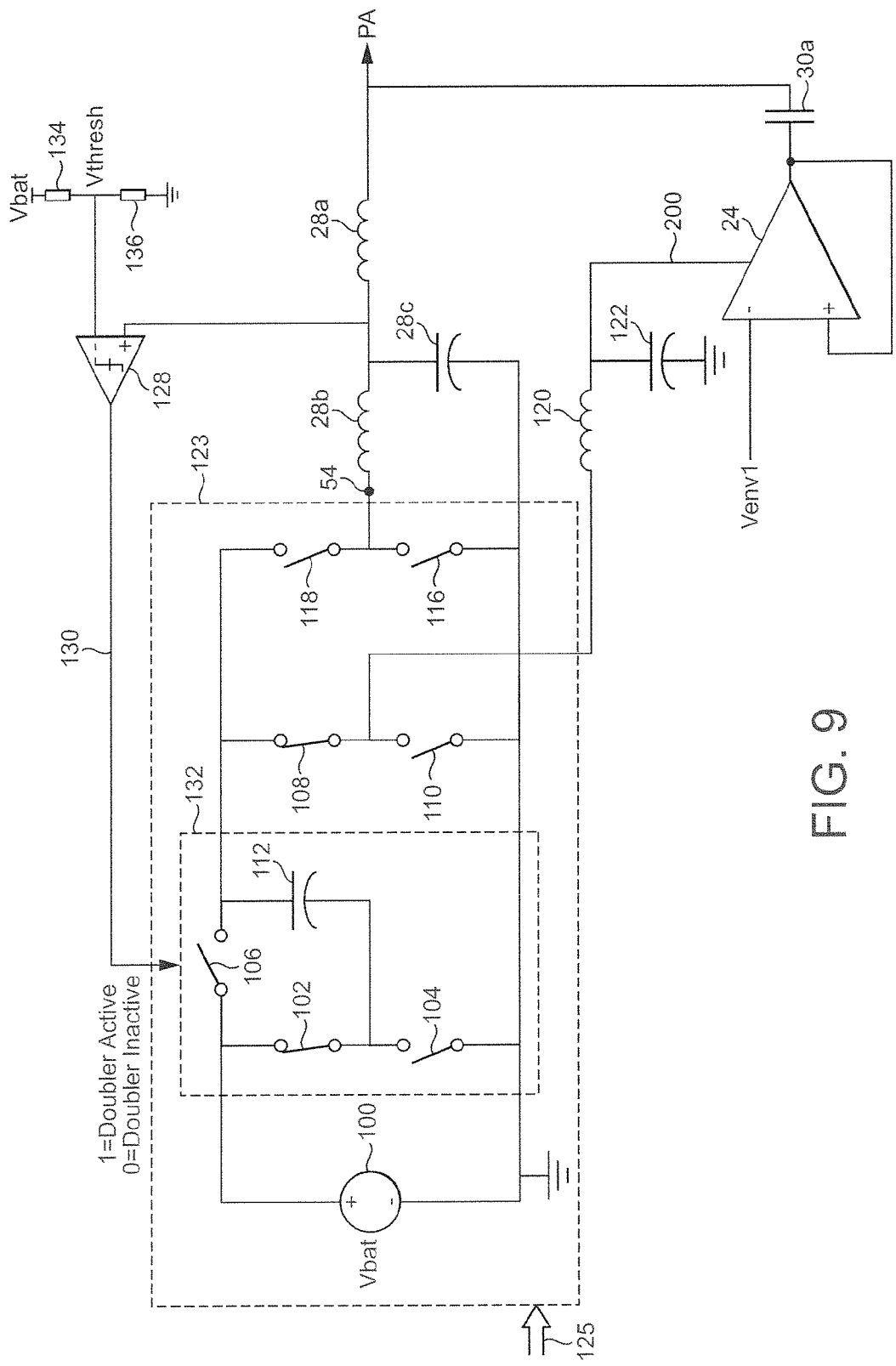
FIG. 9 illustrates further detail of the arrangement of FIG. 3 in an embodiment.
Figure 10:
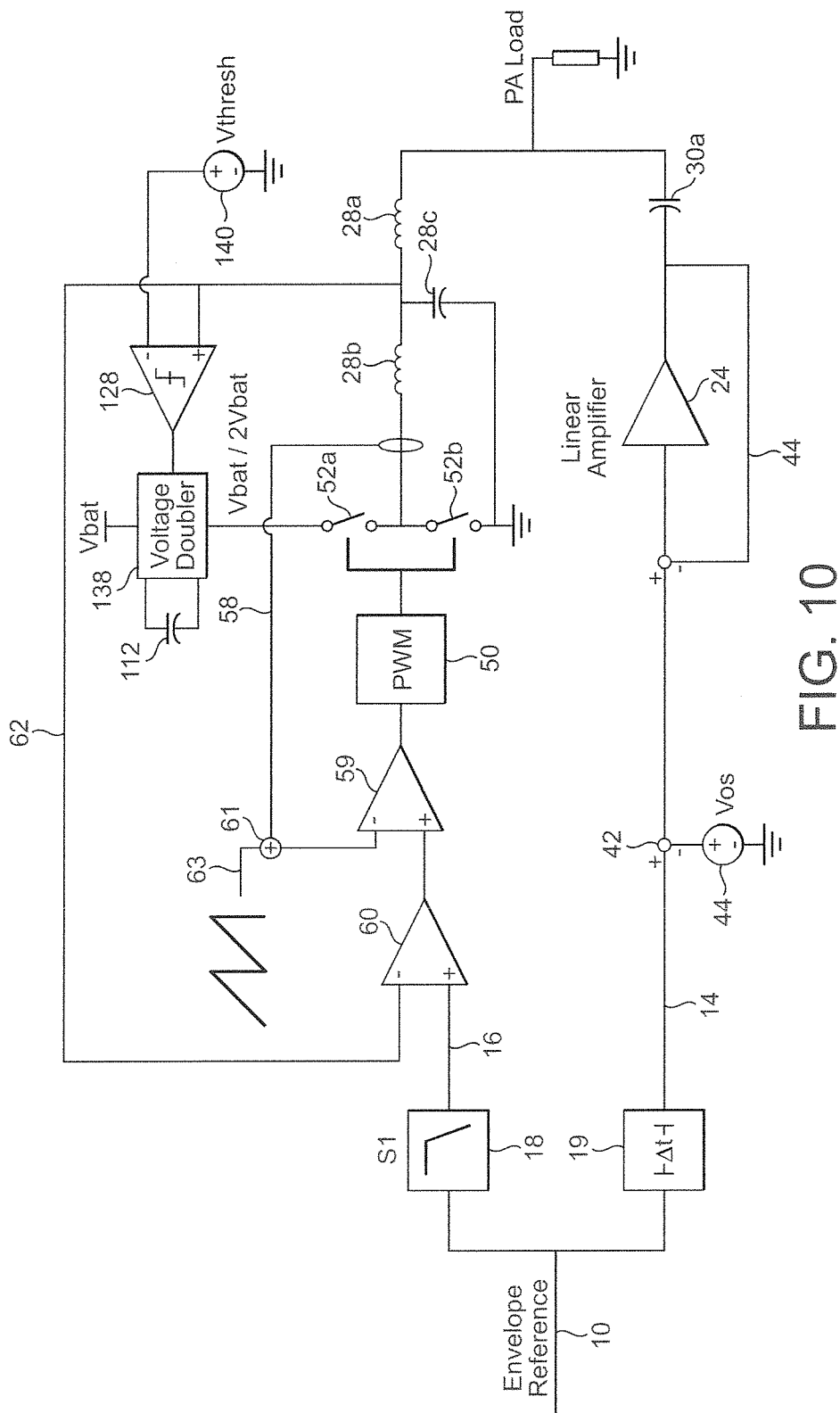
FIG. 10 illustrates further detail of the arrangement of FIG. 3 in an embodiment.

Alternatively to the arrangement of FIG. 8, autonomous control of the boost setting may be possible by comparing the switcher output voltage or a scaled version of the input reference voltage on line 16 of FIG. 10 with a threshold voltage which may be defined as a percentage of the current battery voltage as shown in FIG. 9. This reduces the firmware burden on the baseband controller.

With reference to FIG. 9, a comparator 128 is introduced which generates a control signal on line 130 for enabling/disabling the voltage doubling circuitry provided by the switches 104, 102, 106 and the capacitor 112, generally denoted by reference numeral 123.

The comparator 128 is arranged to compare the output voltage at the switched output, detected at the node at the junction of inductors 28a and 28b and provided as a first input to the comparator 128, with a threshold value at the second input to the comparator 128. The threshold voltage is provided at the junction of resistors 134 and 136, the other terminal of resistor 134 is connected to Vbat, and the other terminal of resistor 136 is connected to electrical ground.

If the voltage doubling circuitry 132 is disabled, the output voltages are generated by the respective output stages comprising switched pairs 108/110 and 116/118 as conventional buck stages. This allows the respective output voltages to switch between 0V and Vbat. When enabled, the voltage doubling circuitry 132 allows the respective output voltages to switch between 0V and 2×Vbat.

In dependence on the comparison in the comparator 128, the voltage doubler circuitry 132 is enabled or disabled by control line 130.

A block level architecture of an envelope tracking modulated power supply, including the auto-enabled boost-buck switcher of FIG. 9, is shown in FIG. 10 in the context of an advantageous feedback architecture in the correction path. In FIG. 10 the supply voltage to the linear amplifier is not shown to simplify the illustration, and therefore a dual-output switched supply is not shown. However it will be apparent how the dual mode switched supply of FIG. 9 may be utilised in the arrangement of FIG. 10 to provide a supply to the linear amplifier 24.

With reference to FIG. 10 there is illustrated an advantageous arrangement in the correction path in which a feedback path for the linear amplifier 24 is taken directly from the output of the linear amplifier, rather than the output of the combiner. In addition the high pass filter 20 of the FIG. 3 arrangement is eliminated. As a result a full-spectrum representation of the reference signal is provided on the path 14 rather than a signal with low frequency components removed, as in the arrangements of FIGS. 1 and 2. Such an arrangement offers efficiency improvements over the prior art, as it allows the peak-to-peak supply voltage of the linear amplifier 24 to be minimised. Embodiments of the invention are preferably implemented in such an arrangement, although the invention and embodiments are not limited to such an advantageous arrangement.

With further reference to FIG. 10, to maximise efficiency, a DC offset is preferably added to the input signal to allow rail-to-rail operation of the linear amplifier 24. The value of the DC offset voltage is chosen to position the DC voltage at the output of the substractor 42 to allow the lowest possible supply voltage to be used for the linear amplifier 24.

The linear amplifier 24 is preferably always operated with the minimum possible supply voltage, which is provided by an efficient switched mode supply. Preferably the supply voltage to the linear amplifier is provided in accordance with the arrangement of FIG. 10 although this is not shown in FIG. 8.

In FIG. 10 any delay associated with the switcher in the low frequency path may optionally be compensated for using a delay matching element in the high frequency path including the linear amplifier, as denoted by delay element 19.

In FIG. 9 and FIG. 10 it is shown that the comparator 128 compares a threshold voltage to the output voltage of the low frequency path. However the output voltage of the low frequency path is derived from the low frequency part of the reference voltage, and the threshold voltage may be compared to any signal which is derived from the low frequency part of the reference voltage. In the arrangement of FIGS. 9 and 10, the threshold voltage may be compared to the signal on line 16, rather than the output of the low frequency path, for example.

Figure 11:
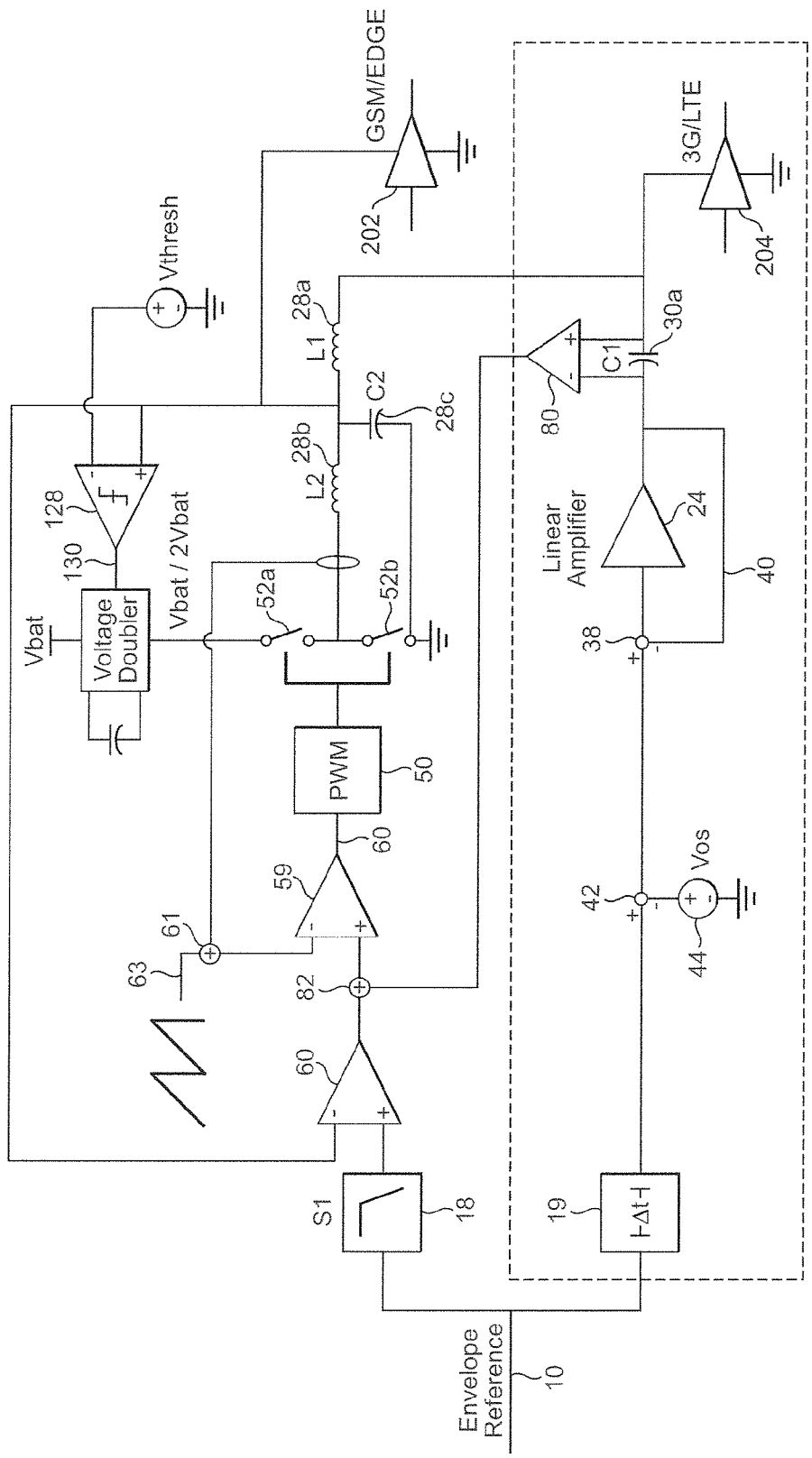
FIG. 11 illustrates further detail of the arrangement of FIG. 3 in an embodiment.

FIG. 11 corresponds to the arrangement of FIG. 10, but with certain optional improvements added. Compared to FIG. 10, FIG. 11 includes mechanisms to suppress resonant feedback.

As illustrated in FIG. 11, in one embodiment a difference amplifier 80 is connected across the high frequency combining element (the capacitor 30a), and provides a correction signal for the path which is arranged to track low frequency variations in the reference signal. This represents a preferred implementation.

In this way, the voltage formed across the capacitor 30a is sensed. A scaled and offset replica of this voltage provided by the difference amplifier 30 is then combined in combiner 82 with the output of the voltage error amplifier 60 of the switched mode amplifier 22 (peak-current-mode buck-converter). The scaling and offsetting is implemented in the amplifier 80.

Thus with reference to FIG. 11, a difference amplifier 80 is provided with inputs connected across the capacitor 30a. The output of the difference amplifier 80 provides an input to a combiner 82, which receives as its other input the output of the voltage error amplifier 60. The combiner 80 combines the output of the difference amplifier 80 with the output of the amplifier 60 to provide the non-inverting input to the amplifier 58.

In an alternative arrangement, this operation may be based on sensing the voltage across, or the current in, the inductor 28a.

In different implementations the sensing circuitry may be arranged to sense current or voltage and the embodiments described herein are exemplary.

Thus in general the voltage or current developed across or in an element of the combiner is sensed, being either a low frequency or high frequency combining element.

A block level architecture of a an envelope tracking modulated power, including the auto-enabled boost-buck switcher of FIG. 11, is shown in FIG. 11 in the context of an advantageous feedback architecture in the correction path. In FIG. 11 the supply voltage to the linear amplifier is not shown to simplify the illustration, and therefore a dual-output switched supply is not shown. It will be apparent how the dual mode switched supply of preceding Figures may provide a supply to the linear amplifier 24.

Figure 12:
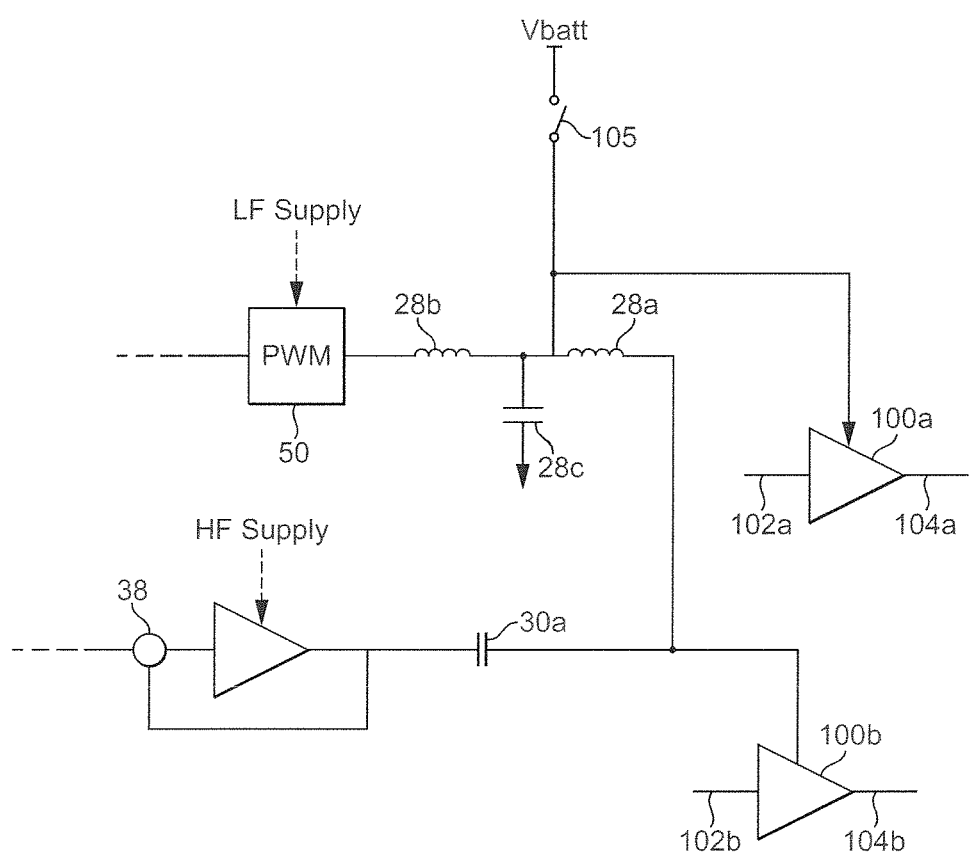
FIG. 12 illustrates a supply voltage bypass in an embodiment of the invention.
Figure 13:
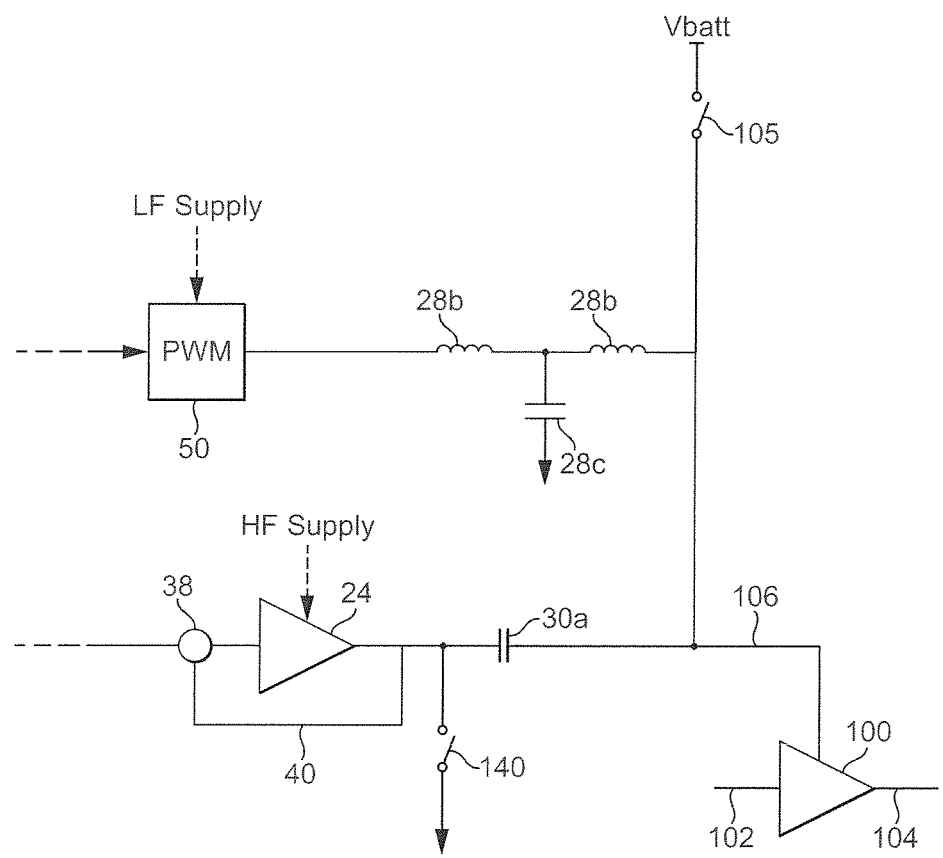
FIG. 13 illustrates a supply voltage bypass in an alternative embodiment of the invention.

FIG. 12 illustrates aspects of earlier Figures, and where aspects of earlier Figures are implemented similar reference numerals are used. FIG. 12, and following FIG. 13, are however used to illustrate further embodiments of the invention.

With reference to FIG. 12 a power amplifier of a 2G operation is denoted by reference numeral 100a, and a power amplifier of a 3G/4G operation is denoted by reference numeral 100b. Each of the power amplifiers 100a and 100b may receive a respective RF input signal on line 102a and 102b, and generate a respective RF output signal on line 104a and 104b.

As denoted in FIG. 12, consistent with the foregoing description, the 2G amplifier 100a receives a supply voltage only from the low frequency path and in 2G operation the high frequency path and 3G/4G amplifier are disabled. The 3G/4G amplifier 100b receives a supply signal from both the low frequency path and the high frequency path, which paths are both enabled and the 2G amplifier 100a is disabled.

The linear amplifier 24 may be disabled by opening switches 108 (not shown in FIG. 12 but shown in earlier Figures), or disabled by other means. In this way the fixed power drain associated with the inevitable quiescent current of the linear amplifier 24 is saved.

When operating in 2G (GSM/EDGE) mode, a physically large inductor may need to be provided at the output of the low frequency path to allow for the potentially large currents which are required in this mode. Currents as high as 2.5 A, for example, may need to be handled in 2G mode. The presence of such large currents dictates that the inductors at the output of the PWM 50 need to be large to handle such currents.

To avoid the need for a physically large inductor, in accordance with this embodiment of the invention, there is additionally provided a supply path directly to the supply voltage $V_{batt}$ via switch 105.

FIG. 12 thus illustrates an arrangement in which a pair of amplifiers 100a and 100b provide power amplification in either 2G or 3G/4G modes of operation in accordance with the principles of this invention as described above. In accordance with this embodiment of the invention, the operation may be applied for low and medium output power. A low or medium power may be defined according to the maximum current ratings of the inductor in the low frequency path.

At higher output powers, however, the configuration may switch to a battery bypass mode, for 2G, in which the battery supply is provided to the 2G amplifier 100a by the power supply $V_{batt}$ via switch 105.

FIG. 13 illustrates a modified arrangement which supports a single RF amplifier (100) capable of 2G and 3G/4G operation in accordance with embodiments of the invention, but which does not require the low frequency path to handle large currents and thereby implement a large inductor.

With reference to FIG. 13 portions of earlier drawings are shown, and reference numerals corresponding to earlier drawings are shown where appropriate. Only those portions of earlier drawings are shown which are required to implement this embodiment. As shown in the embodiment, an output power amplifier 100 is provided having an RF input on line 102 and an RF output on line 104. The RF power amplifier 100 receives a modulated supply voltage on line 106.

In accordance with the foregoing arrangements, the modulated power supply on line 106 is provided either by the low frequency path alone, or by the low frequency path in combination with the high frequency path. Further in accordance with this embodiment, the power supply on line 106 may also be provided directly from the supply voltage, $V_{batt}$, via switch 105.

The single power amplifier 100 is capable of operation in any one of 2G, 3G, or 4G modes. In a low and medium power 2G mode of operation the linear amplifier 24 is disabled and switch 140 is closed and switch 105 is open.

The inductors of the low frequency path 28a, 28b are required to handle the currents necessary for the voltage supply for the 2G operation at low and medium output power. This mode of operation is referred to average power tracking (APT).

However, in accordance with this embodiment, this low frequency path can be further bypassed for high power operation, and the power supply to the amplifier 100 can be provided directly from the supply voltage $V_{batt}$ by closing switches 105 and 140 and disabling linear amplifier 24.

Low or medium power may be defined according to the maximum current ratings of the inductor in the low frequency path, and therefore may be implementation dependent.

The invention and its embodiments relates to the application of envelope tracking (ET) to radio frequency (RF) power amplifiers, and is applicable to a broad range of implementations including cellular handsets, wireless infrastructure, and military power amplifier applications at high frequencies to microwave frequencies.

The invention has been described herein by way of example with reference to embodiments. The invention is not limited to the described embodiments, nor to specific combinations of features in embodiments. Modifications may be made to the embodiments within the scope of the invention. The scope of the invention is defined by the appended claims.

The invention claimed is:

1. An amplification stage including an envelope tracking modulated supply for tracking a reference signal, comprising a low frequency path for tracking low frequency variations in the reference signal and for providing a first output voltage, and a high frequency path for tracking high frequency variations in the reference signal and for providing a second output voltage, and a combiner for combining the first and second output voltages to provide a third output voltage, the amplification stage further comprising a first power amplifier arranged to receive the first output voltage as a supply voltage, and a second power amplifier arranged to receive the third output voltage as a supply voltage, wherein the first and second amplifiers are enabled in different modes of operation.

2. The amplification stage of claim 1 wherein the high frequency path includes a linear amplifier, wherein the linear amplifier is enabled/disabled when the second power amplifier is enabled/disabled.

3. The amplification stage of claim 2 wherein there is provided a feedback path from an output of the linear amplifier to an input of the linear amplifier, such that the linear amplifier is configured to amplify a signal comprising the full spectrum of the frequencies in the reference signal.

4. The amplification stage of claim 1 wherein the first power amplifier is disabled when the second power amplifier is enabled.

5. The amplification stage of claim 1 wherein the second power amplifier is disabled when the first power amplifier is enabled.

6. The amplification stage of claim 1 further comprising means for determining the power in the low frequency path when the first power amplifier is enabled.

7. The amplification stage of claim 6 wherein a path to a DC supply voltage is enabled when the determined power exceeds a threshold.

8. The amplification stage of claim 7 wherein the supply to the first amplifier, when enabled, is arranged to selectively receive either the DC supply voltage or the first output voltage.

9. The amplification stage of claim 6 wherein a path to a DC supply voltage is enabled when the determined power is below a threshold.

10. The amplification stage of claim 1 wherein the first power amplifier is a power amplifier for a 2G or EDGE mode of operation.

11. The amplification stage of claim 1 wherein the second power amplifier is a power amplifier for a 3G or 4G mode of operation.

12. An RF amplifier including the amplification stage of claim 1.

13. A wireless communication system including the amplification stage of claim 1.

14. A wireless mobile device including the amplification stage of claim 1.

15. A method for an amplification stage including an envelope tracking modulated supply for tracking a reference signal, comprising a low frequency path for tracking low frequency variations in the reference signal and for providing a first output voltage comprising a supply voltage for a first amplifier, and a high frequency path for tracking high frequency variations in the reference signal and for providing a second output voltage, and a combiner for combining the first and second output voltages to provide a third output voltage comprising a supply voltage for a second amplifier, wherein the method comprises enabling one of the first and second output amplifiers in different modes of operation.

16. The method of claim 15 further comprising determining the power in the low frequency path, and enabling a path to a DC supply voltage when the determined power exceeds a threshold.

17. The method of claim 16 further comprising disabling the path to the DC supply voltage when the determined power is below the threshold.

18. The method of claim 16 wherein when the first output amplifier is enabled the supply voltage of the amplification stage is either the DC supply voltage or the first output voltage.

19. The method of claim 15 wherein when the second output amplifier is enabled the supply voltage of the amplification stage is the third output voltage.

20. The method of claim 15 wherein the amplification stage is capable of a 2G mode of operation when the first amplifier is enabled or 3G/4G mode of operation when the second amplifier is enabled.

* * * * *